_United States Patent_ [19]

Shinozaki et al.

[11] 4,164,421

[45] Aug. 14, 1979

[54] PHOTOCURABLE COMPOSITION CONTAINING AN O-QUINONODIAZIDE FOR PRINTING PLATE

[75] Inventors: Fumiaki Shinozaki; Tomoaki Ikeda, both of Asaka, Japan

[73] Assignee: Fuji Photo Film Co., Ltd., Minami-ashigara, Japan

[21] Appl. No.: 755,308

[22] Filed: Dec. 29, 1976

Related U.S. Application Data

[63] Continuation of Ser. No. 531,125, Dec. 9, 1972, abandoned.

[30] Foreign Application Priority Data

Dec. 7, 1973 [JP] Japan .............................. 48/139233

[51] Int. Cl.² ............................................. G03G 5/18
[52] U.S. Cl. ........................................ 96/33; 96/49; 96/75; 96/91 D
[58] Field of Search .................... 96/75, 33, 49, 91 D, 96/35.1, 35

[56] References Cited

U.S. PATENT DOCUMENTS

| | | | |
|---|---|---|---|
| 2,892,712 | 6/1959 | Plambeck | 96/91 D |
| 3,390,156 | 6/1975 | Ruchert et al. | 96/91 D |
| 3,495,979 | 2/1970 | Laridon et al. | 96/91 D |
| 3,597,202 | 8/1971 | Ceruimka | 96/91 D |
| 3,635,709 | 1/1972 | Kobayashi | 96/91 D |
| 3,637,644 | 1/1972 | Dunham et al. | 96/91 D |
| 3,679,419 | 7/1972 | Gillich | 96/75 |

_Primary Examiner_—John D. Welsh
_Attorney, Agent, or Firm_—Sughrue, Rothwell, Mion, Zinn and Macpeak

[57] ABSTRACT

A photosensitive printing plate comprising a support having thereon a photosensitive layer comprising a photo-curable composition and an o-quinonediazide compound in an amount of about 0.05 to 4 parts by weight per part by weight of the photo-curable composition.

9 Claims, 1 Drawing Figure

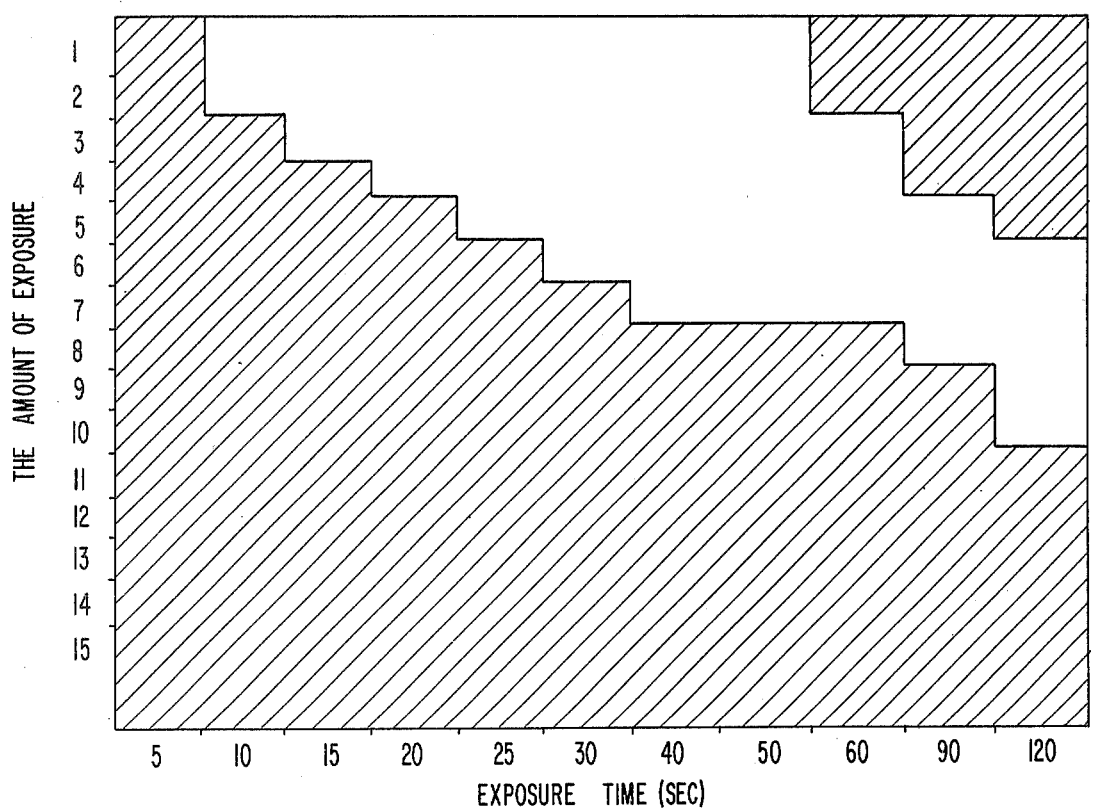

PHOTOCURABLE COMPOSITION CONTAINING AN O-QUINONODIAZIDE FOR PRINTING PLATE

This is a continuation of application Ser. No. 531,125, filed Dec. 9, 1974, now abandoned.

BACKGROUND OF THE INVENTION

1. Field of the Invention

The present invention relates to a photosensitive printing plate. More particularly, the present invention relates to a photosensitive printing plate in which an o-quinonediazide is used.

2. Description of the Prior Art

In general, photosensitive printing plates are classified into planographic plates, intaglio plates, and relief plates. A photosensitive planographic printing plate is produced by rendering the surface of a support hydrophilic by chemically or physically treating the surface or by coating a hydrophilic polymer material on the surface, and then coating the following photosensitive materials on the thus prepared hydrophilic surface. Photosensitive materials for negative working as used in a photosensitive planographic printing plates are a p-diazodiphenylamine-formaldehyde condensation product as described in German Patent No. 596,731 and derivatives thereof, 3-nitroanthranilic acid as described in U.S. Pat. No. 2,729,562, diazo derivatives of aromatic or heterocyclic amines as described in German Pat. No. 949,383, a reaction product of a diazosulfonic acid salt and a diazonium salt as described in U.S. Pat. No. 2,890,115, an acrylic acid ester of pentaerythritol as described in Japanese Patent Publication No. 3271/1971, polyvinyl cinnamate as described in U.S. Pat. No. 3,357,831, and the like; and photosensitive materials for positive working are o-naphthoquinone diazide derivatives as described in Liebig, *Ann. Chem.*, 598,123, (1956), a reaction product of potassium ferrocyanide and p-diazodiphenylamine as described in U.S. Pat. No. 3,113,023, a reaction product of a heteropoly-acid or an isopoly-acid selected from groups Va and VIa of the Periodic Table and a diazonium salt as described in Japanese Patent Publication No. 7663/1964, diazo and a polymer coupler as described in U.S. Pat. No. 2,687,958, tetraallyl borate as described in *Phot. Sci. Eng.*, 16 (4), 300–312, and the like.

Hitherto, as materials for negative working, compounds containing a diazonium salt as a major component have been mainly used. Recently, the development of a presensitized (PS) plate of high printing durability utilizing a photo-cross linking or photo polymerization reaction has been extensively conducted, and some plates have been used practically.

On the other hand, for positive working, ink receptive compounds are used which are changeable into compounds, which can be developed in alcohol or a weak base, by light transformation or light decomposition. Most of the practically used compounds are o-quinonediazido compounds such as o-quinonediazido sulfonyl esters or acid amides, and the like. These compound are changed into 5-membered cyclic carboxylic acids by light irradiation, and the exposed areas are dissolved and removed by developing with an alkaline solution. Thus, a positive image is obtained using a positive original image. This method is described in U.S. Pat. Nos. 3,046,121 and 3,046,122. In addition, various quinonediazide type compounds have been reported. Most of these compounds are low molecular weight compounds, and are crystalline when used alone. As a result, the mechanical strength of the layer is low and it is difficult to print a large number of sheets. Hence, alcohol soluble resins such as a phenolformaldehyde resin, a styrene-maleic anhydride resin, shellac, and the like are used as a binder to prevent the crystal-separation of the photosensitive layer and, at the same time, to improve the mechanical strength of the image obtained. However, there are less of these types of plates having sufficiently satisfactory printing durability as compared with the above described negative type plates.

In order to increase the printing durability, an operation called "burning in" is conducted after exposure and development. In this operation, it is generally necessary to heat the plate at 180° C. for 30 to 40 minutes, and, at this time, considerable care must be taken not to form temperature-unevenness on the surface of the plate. However, the operation is conducted by a plate maker who uses the photosensitive printing plate, and thus, the printing durability, as a matter of fact, varies depending upon the skill of the plate maker.

SUMMARY OF THE INVENTION

An object of the present invention is to provide a photosensitive planographic printing plate which provides a printing plate having high printing durability.

Another object of the present invention is to provide a photosensitive printing plate from which a printing plate can be produced without speical skill.

These objects are attained with a photosensitive printing plate comprising a support having thereon a photosensitive layer comprising a photo-curable composition and an o-quinonediazide compound, in which the o-quinonediazide compound is present in the layer in an amount of about 0.05 to 4 parts by weight per part by weight of the photo-curable composition.

BRIEF DESCRIPTION OF THE DRAWINGS

The FIGURE illustrates the image properties after development in relation to the amount of exposure of the photosensitive printing plate in accordance with the present invention, in which the areas indicated by the oblique lines are the image areas.

DETAILED DESCRIPTION OF THE INVENTION

Photo-curable compositions which can be used in the present invention can be roughly divided into photo-cross linking type compositions and photo-polymerization type compositions.

Photo-cross linking type compositions are those compositions containing a compound having a diazo or azide group, those compositions containing a photosensitive double bond in the molecule, and, in many cases, those compositions containing a carbon-carbon double bond. Of these photo-sensitive double bond containing compositions, those containing a styryl group are effective. For example, those compositions in which a derivative of cinnamic acid or a homolog similar thereto is bound to a side chain or main chain of a polymer are used.

Photo-polymerization type compositions include, for example, those compositions containing monomers with a double bond in a terminal group, and, of these monomers, those monomers containing two or more double bonds in a terminal group are particularly effective.

Needless to say, these monomer sometimes act as a cross linking agent for polymers.

Photo-curable compositions of the cross linking type and of the monomer type are particularly preferred in the present invention in that the photo-cure rate can be freely changed by choosing sensitizing agents for the compositions.

Suitable examples of photopolymerization type compositions which can be used in this invention are described in U.S. Pat. Nos. 3,261,686, 3,380,831, 3,579,339, 3,708,296, 3,708,305, 3,732,107, 3,737,320, 3,741,769, 3,748,132, 3,748,133, and 3,756,827, British Patent Nos. 1,312,492, 1,313,564 and 1,314,556, German Patent (OLS) Nos. 2,238,570, and 2,242,518 and (DAS) No. 2,127,767. Representative examples of photo-cross linking type compositions are described in U.S. Pat. Nos. 2,729,562 and 2,890,115, Kosar, *Light Sensitive Systems*, p321–336 (1965). Examples of compounds having a photosensitive group in the side chain are described in Kosar, supra, p140–151, in German Patent (OLS) Nos. 2,164,625, 2,211,242, and 2,222,472, and in Kato *Journal of Polymer Science (B)*, 1969 p.605, and examples of compounds having a photosensitive group in the main chain are described in U.S. Pat. No. 3,030,208.

Since the sensitivity of these photosensitive compositions itself is low, the irradiation period is long in the absence of a sensitizing agent, and thus generally a sensitizing agent is used simultaneously. Many sensitizing agents are known, and are described in, for example, J. Kosar, *Light Sensitive Systems*. For example, for cross linking type compositions containing a photosensitive double bond, aromatic nitro compounds, aromatic ketones, aromatic quinones, and the like can be used. Representative examples of these compounds are 2,4,7-trinitro-9-fluorene, 5-nitroacenaphthene, p-nitrodiphenyl, p-nitroaniline, picramide, 2-chloro-4-nitroaniline, p,p'-dimethylaminobenzophenone, p,p'-tetramethylaminobenzophenone, 1,2-benzanthraquinone, (3-methyl-1,3-diaza-1,9-benz)anthrone, 1-benzoylamino-4-nitronaphthalene, 1-acetylamino-4-nitronaphthalene, N-methyl-2-benzoylmethylene-β-naphthothiazole, and the like.

On the other hand, sensitizing agents for the monomer type photo-curable compositions include aromatic ketones, aromatic quinones, organic sulfide compounds, photo-reducing agents, halogen compounds, and the like, which are described in, for example, J. Kosar, *Light Sensitive Systems*, pages 158 to 188. Representative examples of these sensitizing agents are carbonyl compounds such as benzophenone, benzil and benzoylethylether, etc., organic sulfur compounds such as dibutylsulfide, benzyldisulfide, decylphenylsulfide, etc., peroxides such as t-butyl peroxide, benzyl peroxide, hydrogen peroxide, etc., nitrogen compounds such as azobis-iso-butyronitrile benzenediazonium chloride, etc., halogen containing compounds such as carbon tetrachloride, silver bromide, 2-naphthalenesulfonyl chloride, etc., anthraquinone compounds such as the dimethylanthraquinones, etc. dyes such as methylene blue, etc.

Incidentally, it is not suitable to use a photo-curable composition containing a diazo group in combination with a o-quinonediazide compound in that the photo-cure rate cannot be controlled freely. However, a photo-curable composition can be used by adjusting the ratio thereof to the o-quinonediazide compound.

Various o-quinonediazide compounds can be effectively used in combination with the photo-curable composition. For example, o-quinonediazide sulfonic acid esters of aromatic polyhyroxy compounds as described in Canadian Patent No. 74,047, and U.S. Pat. Nos. 3,046,111 and 3,046,112 can be used, and particularly esters of polyhydroxyphenyl produced by the polycondensation of acetone and pyrogallol as described in Japanese Patent Publication No. 28403/1968 and o-naphthoquinonediazide sulfonic acid, e.g., 2-diazo-1-naphthol-4-sulfonic acid, 2-diazo-1-naphthol-5-sulfonic acid, and the like are preferred.

More specifically, Canadian Patent No. 747,047 describes naphthoquinone-(1,2)-diazidosulfonic acid ester. U.S. Pat. No. 3,046,111 describes various structural formulae of the same type positive photoresists. That is, U.S. Pat. No. 3,046,111 describes the use of several kinds of diazido residues by reacting an aminohydroxy compound with a sulfonic acid or a sulfonic acid chloride. U.S. Pat. No. 3,046,112 describes, as a certain type of fundamental structure of orthoquinonediazosulfones, the following formulae:

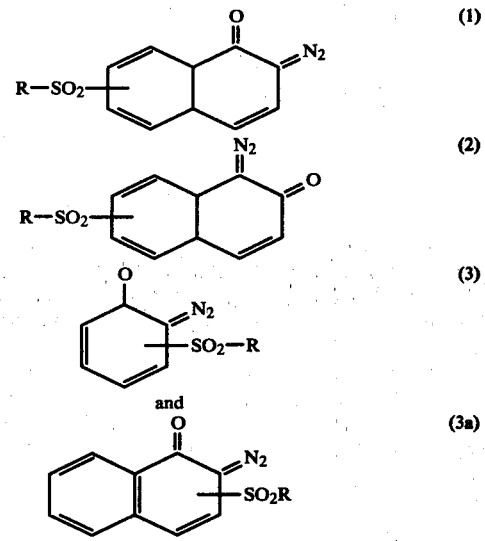

wherein R represents an aryl group or a substituted aryl group. Many modifying methods have been suggested, with resins, dyes and other additives being employed. U.S. Pat. No. 3,046,115 describes that the addition of an auxochromic group will increase the intensity of color.

U.S. Pat. No. 3,046,118 describes the presence of two sulfonic acid residues bonded to an ester. U.S. Pat. No. 3,148,983 suggests the following fundamental structural formula

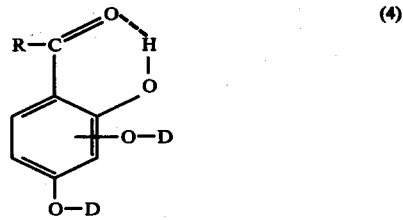

wherein D represents a naphthoquinone-(1,2)-diazido-(2)-5-sulfonyl group, and R represents an aryl group or a substituted aryl group. Further, U.S. Pat. No. 3,184,310 describes a compound containing at least one free hydroxy group and suggests the following general formula

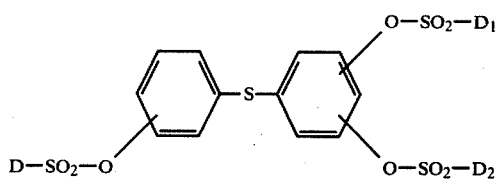 (5)

wherein D, D₁ and D₂ each represents a naphthoquinone-(1,2)-diazido group.

Other quinone diazido compounds known in the art are as follows

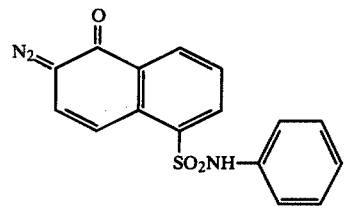 (6)

as described in Japanese Patent Publication No. 1954/62;

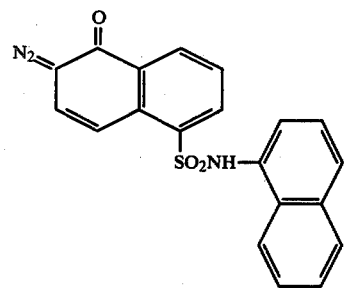 (7)

as described in German Patent No. 854,890;

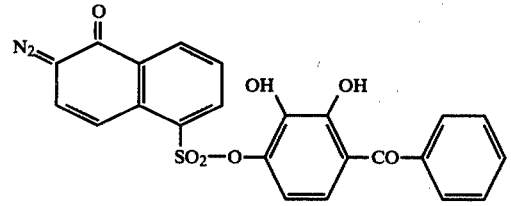 (8)

as described in German Patent 938,233;

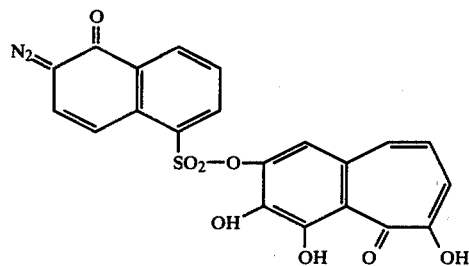 (9)

as described in German Patent 1,124,817;

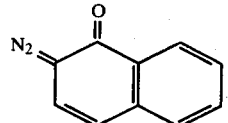
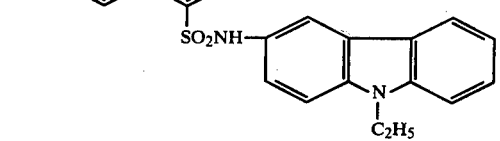 (10)

as described in U.S. Pat. No. 3,046,120 and German Patent No. 865,860;

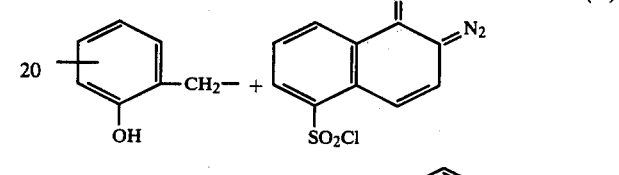 (11)

as described in Japanese Patent Publication No. 5604/70;

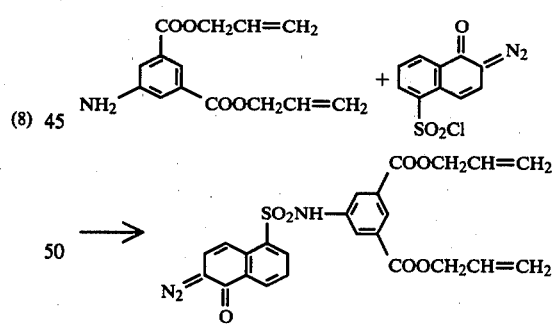

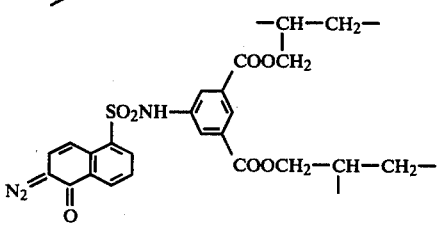 (12)

as described in Japanese Patent Publication No. 26126/65;

Ester of a polycarbonate and naphthoquinone-1,2-diazide sulfonic acid (13)

as described in Japanese Patent Publication No. 24323/69; and

Ester of polyhydroxyphenyl and naphthoquinone-1,2-diazide sulfonic acid.  (14)

Of the above compounds, compounds (11) to (14) are polymeric quinone diazide compounds. Of these light-sensitive materials, the light-sensitive groups are:

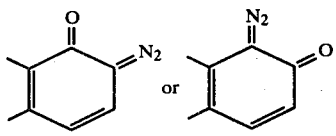

and all can be suitably used in this invention.

Where the photo-cross linking or monomer type photo-curable composition containing a photosensitive double bond in the molecule, or a mixture thereof is used in admixture with o-quinonediazide, it is necessary to control the sensitivity of the photo-curable photosensitive composition so as to enable the formation of a positive working image at the stage of treatment with a developer in the mixed composition, and furthermore to accelerate the curing of the photo-curable photosensitive material at post-exposure.

In general, the curing of the photo-polymer or monomer containing a photosensitive double bond is very slow as compared with a quinonediazide where a sensitizing agent is not added, and thus it is possible to obtain an imagewise positive working image.

However, in this case, where the image formed is exposed overall to effect photo-curing of the image area, a long exposure is required or curing occurs only to a very small extent. Thus, the addition of a sensitizing agent is preferred, but, in the present invention, the addition of the sensitizing agent can be omitted.

With regard to the proportion of the photo-curable composition to the o-quinonediazide compound, where the amount of the o-quinonediazide is quite small and that of the photo-curable photosensitive material is quite large, sometimes no positive working development can be obtained based upon the developer used or negative working development is obtained depending upon the sensitizer used for the photo-curable photosensitive material. In such a case, however, a photo-curable photosensitive material of low sensitivity is used, and, in general, the o-quinonediazide compound is used in a range of about 0.05 to 4 parts by weight per part by weight of the photo-curable composition, preferably in a range of 0.1 to 2 parts by weight, and most preferably in a range of 0.2 to 0.6 parts by weight, and the sensitizing agent is used in a range of less than 170 by weight preferably 0.05 to 0.3% by weight, to the o-quinonediazide compound.

The kind and amount of the sensitizing agent for use in the photo-curable photosensitive material must be chosen in such a manner that a positive working image can be formed. However, where commercially available sensitizing agents are used in admixture with the o-quinonediazide compound in the present invention, it is surprising that a positive working image can be obtained by image exposure using a carbon arc lamp, a fluorescent lamp, a xenon lamp, a super high voltage mercury lamp, or a metal halide lamp, as is generally used in print making. A suitable image exposure time can range from about 20 seconds to 1.5 minutes, and about 2 minutes to 4 minutes for the overall exposure as described herein using a metal halide lamp of 2 KW at a distance of 1 meter, but of course, this can be varied since the time will depend upon the composition employed, etc.

The quantity of the sensitizing agent contained in the photo-curable composition is not particularly important provided that the spectrum absorption range of the sensitizing agent and that of the o-quinonediazide compound do not overlap. This is because the o-quinonediazide can be selectively decomposed by image exposure by separating of wave lengths with a filter. However, most of the sensitizing agents for the so-called photo polymers such as cross linking type photopolymers containing a photosensitive double bond, monomer type compositions containing a double bond in the terminal group, and the like have an absorption region in the range of from the ultraviolet region to about 500 m$\mu$, and thus often the absorption region overlaps that of the o-quinonediazide compound. With regard to these sensitizing agents, they preferably are used in an amount of 0.05 to 0.3% by weight to the weight of the o-quinonediazide compound. Where polyvinyl cinnamate is used as the photo-curable composition, a positive working image can be obtained by using N-methyl-2-benzoylmethylene-$\beta$-naphthothiazole or 5-nitroacenaphthene, which belong to the group of the best sensitizing agents now known as a sensitizing agent for polyvinyl cinnamate.

Where a monomer type composition is used as the photo-curable composition, the sensitizing agent generally is easily influenced by oxygen during the polymerization of the monomer, and thus various research has been conducted to reduce the influence of oxygen during photo polymerization and to increase the photo-curing sensitivity. In contrast to this, in the present invention, it is preferred that the photo-curable composition is influenced by oxygen at image exposure in order to obtain a positive working image.

However, even where a highly sensitive sensitizing agent is used for the photo-curable photosensitive composition, a positive working image can be obtained by changing the amount of the sensitizing agent or adding a polymerization inhibitor. Suitable polymerization inhibitors are, for example, p-benzoquinone, p-tert-butyl-catechol, nitrobenzene, picric acid, dithiobenzoyl sulfide, and copper chloride (II). It is preferred to use a low sensitive sensitizing agent for obtaining a positive working image. However, for increasing the curing rate of the photo-curable composition at exposure, two or more sensitizing agents can be used in admixture with each other. In general, those sensitizing agents which have a maximum absorption peak of 450 m$\mu$ or less are preferably used.

It goes without saying that the photo-curable photosensitive composition can contain simultaneously a cross linking type composition containing a photosensitive double bond and a monomer type composition containing a double bond in a terminal group. When used in combination, the photo-curable composition preferably contains less monomer type composition than cross linking type composition with the photo-curable composition preferably containing about 10% to 60% by weight of the cross -linking type composition. Furthermore the photo-curable composition can contain an additive such as a plasticizer such as dibutylphthalate, dioctylphthalate, butylbenzylphthalate, dinonylphthalate, etc. to increase developing ability. Representative examples of these plasticizers are described under the heading "plasticizer" of Kagaku Daijiten (Encyclopaedia Chimica) published by Kyoritsu Shuppab Co., Ltd.

The developer used after exposure varies depending upon the photosensitive material used, and a developer comprising an alkaline aqueous solution, e.g., having a pH ranging from about 8 to 13 is preferably used. Suitable alkalis, include known compounds such as alkali metal e.g., sodium, potassium, etc., and ammonium salts of silicates (for example, an alkali metal silicate such as sodium silicate is preferred), phosphates (for example, sodium triphosphate), carbonates, bicarbonates and borates, alkali metal hydroxides, e.g., sodium hydroxide, potassium hydroxide, lithium hydroxide, etc., organic bases such as triethanolamine, diethanolamine, monoethanolamine, etc. and the like. If desired, water-miscible alcohol based solvents, e.g., alcohols such as benzyl alcohol, ketones such as acetone, cyclic ethers such as dioxane and the like can be added, e.g., less than 30% by weight, preferably 1 to 6% by weight.

Needless to say, the developed plate has the capability for use as a positive type printing plate, but it is preferred that the positive working be exposed overall after development to provide a printing plate having higher printing durability. It is preferred that sufficient overall exposure is applied to cure the photo-curable composition sufficiently. The irradiation period required for the overall exposure should be made as short as possible by choosing suitably the kind and amount of sensitizing agent. Suitable light sources for use in plate making are those light sources generally used such as a super high voltage mercury lamp, a metal halide lamp, a xenon lamp, a carbon arc lamp, and the like, which are described hereinbefore. The use of a super high voltage mercury lamp or metal halide lamp generating a large amount of ultraviolet light is suitable for increasing the sensitivity at imagewise exposure and all exposure stages. Needless to say, the irradiation apparatus for use in the imagewise exposure can be different from that for use in the post-exposure.

In accordance with the method of the present invention, not only can a positive working printing plate of high printing durability be produced, but also a plate of both the positive and negative type can be obtained by controlling the exposure time. That is, a negative image relative to the original image can be obtained by applying an exposure amount sufficient to cure the photo-curable composition, applying overall exposure sufficient to render the unexposed areas of the photosensitive layer soluble in an alkaline developer, and treating with the alkaline developer.

Furthermore, with a conventional PS plate, a developing ink is applied on the image areas after development or burning in to protect the oil-receptivity of the image areas at the stage of applying gum arabic, and the procedure requires skill. However, in the case of using the method of the present invention, the oil-receptivity of the images and lines can be greatly increased by the overall exposure after the formation of the image, and thus it is not necessary to use a developing ink.

Furthermore, the defect of the conventional positive type PS plate is inferior to planographic and deep-etched plates from the standpoint of erasure at plate making. In accordance with the method of the present invention, the areas to be erased can be easily erased with an erasing liquid by shielding the areas from light at post exposure, which is one of the advantages of the present invention. Also, the erasure can be conducted by shielding the areas to be erased from light at post exposure, removing the light shield, exposing the plate for a short period of time so that the shielded areas are developed to positive working, and treating with a developer.

The present invention will be explained in greater detail by reference to the following examples. Unless otherwise indicated, all parts, percents, ratios and the like are by weight.

EXAMPLE 1

A degreased 3s aluminum plate was subjected to anodic oxidation in a 20% sulfuric acid solution at 30° C. with a current density of 3 A/dm$^2$ for 2 minutes. The following photosensitive composition was coated in a thickness of 2$\mu$ on the thus prepared aluminum plate.

| Photosensitive Composition | |
| --- | --- |
| Poly-$\beta$-cinnamoyloxyethylmethacrylate ([$\eta$] = 0.14) | 1 g |
| Adduct of the Condensation Product of Acetone and Pyrogallol (n = 3) and 2-Diazo-1-naphthol-4-sulfonylchloride | 0.3 g |
| Dihexyl Phthalate | 0.3 g |
| Nitroacenaphthene | 80 mg |
| 1,2-Dichloroethane | 12 g |
| Methylcellosolve Acetate | 6 g |

After drying at 80° C. for 3 minutes, the thus coated plate was exposed through a positive original image to a printing apparatus equipped with a mercury lamp (trade name: Jet Printer 2000; produced by Oku Co., Ltd.; 2 KW super high voltage mercury lamp; 50 cm separation of light source and plate) for 15 seconds, and then the plate was developed using the following developer. Thus, a positive working image was obtained.

| Developer | |
| --- | --- |
| Water | 1 liter |
| JIS No. 1 Sodium Silicate* | 12 g |
| Butyl Cellosolve | 20 ml |
| Benzyl Alcohol | 20 ml |

(*SiO$_2$/Na$_2$O = 2.1 to 2.3; SiO$_2$ = 36 to 38% by weight)

After drying, the plate was subjected to overall exposure using a printing apparatus for 3 minutes, and then the plate was placed in a printing machine. Thus, 200,000 sheets of excellent prints were obtained.

On increasing the exposure time during which the plate was exposed through a positive pattern, the curing of the photo-curable composition began. On exposure for 3 minutes, and overall exposure for 15 seconds, and developing the above developer, a negative image was formed. The thus prepared plate was placed in a Hamaduster 500 CD printing machine, and excellent prints were obtained.

EXAMPLE 2

The procedure of Example 1 was repeated wherein N-methyl-2-benzoylmethylene-$\beta$-naphthothiazole was used in place of nitroacenaphthene in the photo-curable photosensitive composition described in Example 1 and overall exposure was conducted for 2 minutes after drying. With the thus prepared printing plate, excellent prints were obtained.

EXAMPLE 3

The procedure of Example 1 was repeated wherein 10 mg of N-methyl-2-benzoylmethylene-β-naphthothiazole was added to 80 mg of nitroacenaphthene as a sensitizing agent for the photocurable photosensitive composition of Example 1. With the thus prepared printing plate, excellent prints were obtained.

EXAMPLE 4

The procedure of Example 1 was repeated wherein the overall exposure was omitted. With the thus prepared printing plate, 30,000 sheets of excellent prints were obtained.

EXAMPLE 5

The following photosensitive composition was coated in a thickness of a 2μ on the aluminum plate of Example 1.

| | |
|---|---|
| Condensation Product of p-Phenylene Diacrylic Acid and 1,4-bis(β-Hydroxyethoxy)cyclohexane [η] = 0.15 | 1 g |
| Adduct of the Condensation Product of Acetone and Pyrogallol (n = 3), and 2-Diazo-1-naphthol-4-sulfonylchloride | 0.4 g |
| Dihexylphthalate | 0.2 g |
| 5-Nitroacenaphthene | 80 mg |
| 1,2-Dichloroethane | 12 g |
| Methylcellosolve Acetate | 6 g |

After drying at 80° C. for 3 minutes, the thus coated plate was exposed through a positive original image to the same printing apparatus equipped with a mercury lamp (Jet Printer 2000) as described in Example 1, developed with the same developer as described in Example 1, and after drying, subjected to overall exposure using the above apparatus for 90 seconds. The thus prepared printing plate was placed in the printing machine, and excellent prints were obtained.

EXAMPLE 6

The procedure of Example 1 was repeated wherein the imagewise exposure was conducted at a distance of 1 m for 30 seconds using a PS Light S type (metal halide, 2 KW) produced by the Fuji Photo Film Co., Ltd, in place of the Jet Printer as the printing apparatus, and overall exposure was conducted for 6 minutes. With the thus prepared printing plate, a result similar to that of Example 1 was obtained.

EXAMPLE 7

A 3S aluminum plate was subjected to graining using alundum of 2.5 mesh on both sides thereof, and dipped in a 20% sodium triphosphate solution heated to 70° C. for 1 minute.

After water-washing, the plate was dipped in a 70% nitric acid solution for 1 minute. Then, the plate was dipped in a 2% aqueous solution of JIS No. 2 sodium silicate (produced by Nippon Kagaku Co., Ltd.; $SiO_2/Na_2O = 2.45$–$2.55:1$) at 80° to 85° C. for 2 minutes. After water-washing, the following photosensitive solution was coated in a thickness of 2μ using a whirler.

| | |
|---|---|
| Poly(β-cinnamoyloxyethylmethacrylate/ methacrylic acid) (90/10 molar ratio) [η] = 0.14 | 1 g |
| Adduct of the Condensation Product of Acetone and Pyrogallol (n = 3), and 2-Diazo-1-naphthol-4-sulfonylchloride | 0.5 g |
| Nitroacenaphthene | 90 mg |
| 1,2-Dichloroethane | 10 g |
| Methylcellosolve Acetate | 9 g |

After drying at 80° C. for 3 minutes, the plate was exposed through a positive original image using a Jet Printer 2000 for 15 seconds, and then the plate was developed with the following developer.

| | |
|---|---|
| Water | 2 liters |
| JIS No. 1 Sodium Silicate (produced by Wako Jyunyaku Co., Ltd.) | 50 g |
| Butylcellosolve | 300 ml |

After drying, the plate was subjected to overall exposure using the above printing apparatus for 3 minutes. The thus prepared printing plate was placed in a printing machine, and excellent prints were obtained.

EXAMPLE 8

On the same aluminum plate as described Example 7, the following photosensitive solution was coated in a thickness of 2μ using a whirler.

| | |
|---|---|
| Poly(methylmethacrylate/methacrylic acid) (90/10 molar ratio) [η] = 0.14 | 1 g |
| Pertaerythritol Tetraacrylate | 0.7 g |
| Adduct of the Condensation Product of of Acetone and Pyrogallol (n = 3), and 2-Diazo-1-naphthol-4-sulfonyl- chloride | 0.5 g |
| 2-t-Butylanthraquinone | 90 mg |
| 1,2-Dichloroethane | 12 g |
| Methylcellosolve Acetate | 6 g |

After drying at 80° C. for 3 minutes, the plate was exposed through a positive original image using a Jet Printer for 15 seconds, and developed with the following developer. Thus, a positive working image was obtained.

| | |
|---|---|
| Water | 1 liter |
| JIS No. 1 Sodium Silicate | 12 g |
| Butylcellosolve | 60 ml |

After water-washing, the plate was subjected to overall exposure using the above printing apparatus for 2 minutes. The thus prepared printing plate was placed in a printing machine, and excellent prints were obtained.

EXAMPLE 9

On the same aluminum plate as described in Example 7, the following photosensitive composition was coated in a thickness of 2μ by means of a whirler.

| Photosensitive Composition | |
|---|---|
| Poly(β-cinnamoyloxyethylmethacrylate/ methacrylic acid) (90/10 molar ratio) | 1 g |
| Pentaerythritol Tetraacrylate | 0.5 g |
| Adduct of the Condensation Product of Acetone and Pyrogallol (n = 3), and 2-Diazo-1-naphthol-4-sulfonylchloride | 0.5 g |
| 2-t-Butylanthraquinone | 90 mg |

-continued

| Photosensitive Composition | |
|---|---|
| 1,2-Dichloroethane | 12 g |

After drying at 80° C. for 3 minutes, the plate was exposed using the printing apparatus described in Example 1 for 20 seconds, and a positive working image was obtained using the following developer.

| Water | 1 liter |
|---|---|
| JIS No. 1 Sodium Silicate | 4.5 g |
| Butylcellosolve | 7.5 g |
| Benzyl Alcohol | 7.5 g |

After water-washing, the plate was subjected to overall exposure using the above printing apparatus for 2 minutes. Thus prepared printing plate was placed in a printing machine, and excellent prints were obtained.

On the other hand, the above photosensitive printing plate was developed with the above developer and changing the exposure time using a Fuji PS step guide produced by the Fuji Photo Film Co., Ltd. (15 steps $\Delta D=0.15$) and the printing apparatus. The FIGURE Illustrates the condition at which the photosensitive layer is removed.

As can be understood from the FIGURE, in the case of this plate, the exposure through a pattern image was conducted for 2 minutes, and then overall exposure was conducted for 15 seconds. In this way, the exposed plate was developed with the above developer and thus a negative working image relative to the pattern image was formed. The thus prepared printing plate was placed in a printing machine, and excellent prints were obtained.

That is, it can be understood that a plate for both negative and negative types can be produced by using the above plate and by changing the exposure time with the same developer.

EXAMPLE 10

The following photosensitive solution was coated in a thickness of 2μ on the same aluminum plate as described in Example 7.

| Condensation Product of p-Phenylene-<br>diacrylic Acid and 1,4-bis(βHydroxy-<br>ethoxy)cyclohexane [η] = 0.15 | 1 g |
|---|---|
| Adduct of the Condensation Product of<br>acetone and Pyrogallol (n = 3), and<br>2-Diazo-1-naphthol-4-sulfonylchloride | 0.5 g |
| Pentaerythritol Tetraacrylate | 0.7 g |
| 2-t-Butylanthraquinone | 0.1 g |
| 1,2-Dichloroethane | 12 g |
| Methylcellosolve Acetate | 8 g |

After drying at 80° C. for 3 minutes, the plate was exposed using a printing apparatus for 15 seconds, and a positive working image was obtained using the following developer.

| Water | 1 liter |
|---|---|
| JIS No. 1 Sodium Silicate<br>(produced by Wako Jyunyaku Co., Ltd.) | 14 g |
| Butylcellosolve | 65 ml |

After water-washing and drying, overall exposure was conducted for 3 minutes using a printing apparatus. The thus prepared printing plate was placed in a printing machine, and excellent prints were obtained.

EXAMPLE 11

A plate subjected to post-exposure for 3 minutes and a plate not subjected to post-exposure were dipped in a butylcellosolve solution and cleaned. In the case of the latter, the image areas were easily removed, whereas the former, that is, the plate subjected to the post-exposure, was sufficiently durable for cleaning. In this way, the area to be removed could be easily removed by shielding it from light during post-exposure.

While the invention has been described in detail and with reference to specific embodiments thereof, it will be apparent to one skilled in the art that various changes and modifications can be made therein without departing from the spirit and scope thereof.

What is claimed is:

1. A process for preparing a printing plate which comprises:
(1) imagewise exposing to such an exposure amount so that a positive working image can be obtained with actinic light in the visible to ultraviolet range a positive type photosensitive material comprising a support having thereon a photosensitive layer comprising an admixture of:
 (A) a photocurable composition containing a member selected from the group consisting of
  (a) a polymer selected from the group consisting of poly-β-cinnamoyloxyethyl methacrylate, copolymers of β-cinnamoyloxyethyl methacrylate and methacrylic acid, and condensation products of p-phenylenediacrylic acid and 1,4-bis(β-hydroxyethoxy)cyclohexane,
  (b) pentaerythritol tetraacrylate
  (c) a mixture of said polymer (a) and said pentaerythritol tetraacrylate, and
 (B) a photosensitive o-quinonediazide compound selected from the group consisting of esters of polyhydroxyphenyl comprising the polycondensation product of acetone and pyrogallol, and o-naphthoquinonediazide sulfonic acid in an amount of about 0.05 to about 4 parts by weight per part by weight of said photocurable composition (A),
(2) developing with a developer comprising an alkaline aqueous solution, and
(3) exposing said developed printing plate overall with actinic light in the visible to ultraviolet range to cure the formed image of said photo-curable composition (A).

2. The process according to claim 1, wherein said polymer (a) is a polymer selected from the group consisting of polymers containing a residue of cinnamic acid or of a homolog similar thereto bound to a side chain or to a main chain of a polymer.

3. The process according to claim 2, wherein said polymer (a) is poly-β-cinnamoyloxyethylmethacrylate or a copolymer of β-cinnamoyloxyethylmethacrylate and methacrylic acid.

4. The process according to claim 1, wherein said monomer (b) is a monomer selected from the group consisting of monomers containing 2 or more double bonds in terminal group(s).

5. The process according to claim 1, wherein said photo-curable composition further contains a copolymer of methyl methacrylate and methacrylic acid.

6. The process according to claim 1, wherein said photo-curable composition (A) further contains at least one sensitizing agent in an amount of less than 170% by weight to the o-quinonediazide compound.

7. The process according to claim 6, wherein said sensitizing agent is selected from the group consisting of aromatic nitro compounds, aromatic ketone compounds, aromatic quinone compounds, organic sulfur compounds, photo-reducing agent dyes and halide compounds.

8. The process according to claim 1, wherein said alkaline aqueous solution contains at least one compound selected from the group consisting of alkali metal salts and ammonium salts of silicates, carbonates, hydrogen carbonates and borates, alkali metal hydroxides and organic bases.

9. The process according to claim 8, wherein said alkaline aqueous solution further contains a member selected from the group consisting of alcohols, ketones and cyclic ethers in an amount of less than 30% by weight based on the weight of said alkaline aqueous solution.

* * * * *